United States Patent [19]
Wylie

[11] Patent Number: 5,320,972
[45] Date of Patent: Jun. 14, 1994

[54] METHOD OF FORMING A BIPOLAR TRANSISTOR

[75] Inventor: Ian W. Wylie, Nepean, Canada

[73] Assignee: Northern Telecom Limited, Montreal, Canada

[21] Appl. No.: 1,706

[22] Filed: Jan. 7, 1993

[51] Int. Cl.[5] .......................................... H01L 21/328
[52] U.S. Cl. .......................................... 437/31; 437/33; 437/89; 148/DIG. 26; 148/DIG. 124
[58] Field of Search .......................... 437/31, 89, 33; 148/DIG. 26, DIG. 124; 257/588, 576

[56] References Cited

U.S. PATENT DOCUMENTS

| | | | |
|---|---|---|---|
| 4,988,632 | 1/1991 | Pfiester | 437/31 |
| 5,034,351 | 7/1991 | Sun et al. | 437/228 |
| 5,055,419 | 10/1991 | Scovell et al. | 437/31 |
| 5,057,455 | 10/1991 | Foo et al. | 437/193 |
| 5,064,774 | 11/1991 | Pfiester | 437/31 |
| 5,169,794 | 12/1992 | Iranmanesh | 437/31 |
| 5,194,926 | 3/1993 | Hayden | 257/565 |
| 5,208,169 | 5/1993 | Shah et al. | 437/31 |

FOREIGN PATENT DOCUMENTS 1-71166  3/1989  Japan .................................. 437/200

OTHER PUBLICATIONS

Wolf, S., et al., Silicon Processing, vol. 1, 1986, Lattice Press, pp. 182-195.
High-Speed Polysilicon Emitter-Base Bipolar Transistor, IEEE Electron Device Letters, vol., EDL-7, No. 12, Dec. 1986, pp. 658-661, Park et al.
A High-Speed Bipolar Technology Featuring Self-Aligned Single-Poly Base and Submicrometer Emitter Contacts, IEEE Electron Device Letters, vol., 11, No. 9, Sep. 1990, pp. 412-414, Huang et al.

Primary Examiner—T. N. Quach
Attorney, Agent, or Firm—Angela C. de Wilton

[57] ABSTRACT

A process is provided for forming a bipolar transistor and a structure thereof. In particular a single polysilicon self-aligned process for a bipolar transistor having a polysilicon emitter is provided. A sacrificial layer defining an opening is provided in a device well region of a substrate, and, after forming a self-aligned base region within the opening, emitter material is selectively provided in the opening to form an emitter-base junction. The sacrificial layer functions as a mask for ion implantations to form the base region, and if required, an underlying local collector region. The sacrificial layer is removed, to expose the well region adjacent sidewalls of the emitter structure. A self-aligned link region implant may be performed before forming isolation on exposed sidewalls of the emitter structure. Extrinsic base contacts are formed in the surface of the surrounding well region. The sacrificial layer is preferably a material which may be removed by an etch process with high selectivity to the substrate to avoid damage on overetching, for improved manufacturability and reliability. The process flow is compatible with CMOS processing, and applicable to bipolar CMOS integrated circuits.

27 Claims, 4 Drawing Sheets

METHOD OF FORMING A BIPOLAR TRANSISTOR

FIELD OF THE INVENTION

This invention relates to a method of forming a bipolar transistor and a bipolar transistor structure.

BACKGROUND OF THE INVENTION

In fabrication of bipolar transistors for silicon integrated circuits, a conventional "double-polysilicon" structure is formed with two layers of polysilicon, using a first polysilicon layer for base electrodes and a second polysilicon layer for an emitter electrode. Polysilicon is a preferred emitter material compared with single crystal silicon to improve forward current gain of the transistor. Thus, increased doping of the base can be used to prevent premature punchthrough when using shallow base widths required for high speed operation. In a double-polysilicon structure, the collector-base overlap area may be reduced if the extrinsic base contact is opened in an area of the base polysilicon layer which extends over a field isolation layer, rather than directly over the active device area. Thus the collector-base parasitic capacitance is reduced, and reduced spacing between a self-aligned emitter and base electrodes may be achieved.

Processes are known for fabrication of bipolar transistors having a self-aligned structure, using a first polysilicon layer for the extrinsic base contact and a second polysilicon layer for the emitter contact, for example as described in an article entitled "High Speed Polysilicon Emitter-Base Bipolar Transistor" by Hee K. Park et al., IEEE Electron Device Letters, EDL-7 No. 12 December 1986. Self-alignment of the base and the emitter allows for minimization of both the extrinsic base resistance and the collector-base junction capacitance.

In a conventional known process for fabricating a bipolar transistor for a bipolar and complementary metal oxide semiconductor (BiCMOS) integrated circuit, a typical process flow includes the following steps: a substrate is provided in the form of semiconductor wafer having an N epitaxial (epi-)layer overlying a N+ buried layer. The latter forms a buried collector. A device well region is defined in the N epi-layer and a field oxide isolation layer is formed surrounding the device well region. Then a first (base) polysilicon layer is deposited overall, extending over the device well region. The first polysilicon layer is photoengraved (PE) and etched to open a hole in first polysilicon layer, which forms an emitter opening. An intrinsic base region is formed in the device well within the emitter opening. A dielectric layer, typically silicon dioxide, is formed over first polysilicon layer, and dielectric sidewall spacers are formed on exposed sidewalls of the base polysilicon layer defining the emitter opening. A second polysilicon layer is then deposited, forming an emitter-base junction on the intrinsic base region, and the second polysilicon layer patterned to form an emitter structure isolated from the base polysilicon layer by the dielectric layer and the sidewall spacers. Contacts to the first and second polysilicon layers are then formed in a conventional manner.

The latter double-polysilicon process requires deposition of first and second polysilicon layers and the resulting structure has highly non-planar topography. In particular, the topography of the polysilicon layer forming the emitter may have a sharp discontinuity in the emitter region, requiring a very thick polysilicon layer to fill the emitter opening without leaving voids. The non-planar topography of the thick polysilicon layer complicates subsequent processing steps, including metallization and dielectric planarization, and creates problems in contact imaging, and contact etch selectivity. The depth differential of the contact to the emitter and the contact to a sinker for contacting the collector (or to a nearby CMOS well contact in a BiCMOS process) may be very large, and the contacts are in close proximity to one another. The resulting high aspect ratio contact holes are difficult to silicide, and contact etch selectivity to the underlying layers may be a problem.

A major disadvantage of this latter process is that there is a risk of damage to the emitter-base junction area of the substrate silicon during etching of the emitter opening in the first polysilicon layer, because there is no etch stop, i.e. there is little or no etch selectivity for etching polysilicon relative to the underlying silicon. Damage to the emitter-base junction region due to over-etching can have severe implications for device reliability, e.g. increased transistor noise which is detrimental to analogue applications. If the sidewall spacer oxide has incomplete conformality, variable recessing of the base during silicon over-etch, and consequent sidewall spacer width variability, can lead to variability in emitter width. The ensuing variations in emitter-base capacitance along the sidewall spacer edge and emitter polysilicon contact area cannot be avoided without exacerbating the topography related problems.

Furthermore, the process does not allow for the link region of the base to be more deeply or more heavily doped than the base implant doping, leading to higher than desirable base resistance and/or emitter-base edge leakage problems.

Thus, the latter process for a double-polysilicon self-aligned NPN bipolar transistor is complex and suffers from a number of process related problems, which lead to issues including poor manufacturability, i.e. low yield, and unsatisfactory device reliability.

As described in an article entitled "A High Speed Bipolar Technology Featuring Self-Aligned Single Poly Base And Submicrometer Emitter Contacts" by W. M. Huang et al. IEEE Electron Device Letters vol. 11, No. 9, September 1990, problems with etching double polysilicon structures may be avoided by fabricating the emitter contact with the first layer of polysilicon. The latter process is known as the "STRIPE" (self-aligned trench isolated polysilicon electrodes) process. The polysilicon layer is etched to define trenches for isolating the emitter region from the base regions. A low energy boron implant into the trench region defines a link region. Then the trench is filled with oxide and then the emitter region is N+ doped by an arsenic implant. This process reduces the possibility of etch damage of the active emitter area and avoids the highly non-planar topography of the conventional double polysilicon process. However, other process related problems remain in the PE and subsequent processing steps, including etching of the polysilicon layer to form narrow trenches (0.2 to 0.4 $\mu$m) for isolation between the emitter and base regions.

Another approach to forming a single polysilicon self-aligned bipolar transistor, comprises forming a base region in the device well similarly as described above, and then forming an emitter structure by depositing a layer of polysilicon overall, patterning and etching the polysilicon to leave an emitter structure in the form of a mesa, and isolating the emitter mesa with oxide sidewall spacers, and then forming contacts to the base contact region surrounding the emitter mesa. For example, a process of this type described in U.S. Pat. No. 5,055,419 to Scovell, entitled "Method Of Manufacturing A Bipolar Transistor", issued 8 Oct. 1991. However, the latter process does not avoid the risk of damage to the underlying silicon layer in the base contact region during overetching of the polysilicon layer defining the mesa.

While other processes for formation of bipolar transistors are known, it is also desirable for bipolar CMOS integrated circuits that a process for forming a bipolar transistor should be compatible with conventional known silicon technology for CMOS processes, so that optimal performance of both bipolar and CMOS devices can be achieved without unduly adding to the overall number of process steps and process complexity.

SUMMARY OF THE INVENTION

The present invention seeks to provide a bipolar transistor structure and a method of forming a bipolar transistor structure in which the above mentioned problems are avoided or reduced.

According to one aspect of the present invention, there is provided a method of forming a bipolar transistor comprising: providing a substrate for an integrated circuit comprising a semiconductor layer having a device well region of a first conductivity type; providing a sacrificial layer overall and patterning the sacrificial layer to define an opening therethrough over the device well region; forming a base region of a second conductivity type within the opening; providing a layer of an emitter material of the first conductivity type filling the opening in the sacrificial layer to form an emitter structure, the emitter structure forming an emitter-base junction with the base region; removing the sacrificial layer and exposing sides of the emitter structure; providing a dielectric isolation layer on exposed sides of the emitter structure; and forming base contact regions of the device well region adjacent the emitter-base junction.

Thus, the emitter material is provided selectively in the emitter-base junction region of the device well region, to form an emitter-base contact structure, before forming the base contacts. The order of processing simplifies and improves control of a number of processing steps. The opening in the sacrificial layer defining an emitter stripe region is in effect in reverse contrast to that of a conventional double-polysilicon process flow mask, and the sacrificial layer functions as the mask not only for defining the emitter structure, but for ion implantations to form the intrinsic base region, and if required, an underlying local collector region. A layer of conductive material forms the emitter structure selectively in the emitter opening in the masking layer, for example, a layer of polysilicon which may be deposited overall and etched back. Advantageously, etching back by chemical mechanical polishing provides a fully planarized surface. Alternatively, the emitter material may be grown selectively within the opening in the emitter masking layer. Preferably, the material of the sacrificial layer may be etched selectively relative to the underlying layers of the substrate, including the underlying well region, so that damage to the substrate on removal of the sacrificial layer is minimized.

The sacrificial layer defining the emitter stripe region provides for a base implant, and a local collector implant if required, to be self-aligned with the emitter stripe. The latter reduces the excess capacitance if the rest of the N well has been lightly doped. The sacrificial layer defining the emitter opening obviates the need for a trade-off between the different implants, and allows almost independent tuning of the two regions. A self-aligned link implant can be provided in the link region of the base, adjacent the emitter-base junction, to more highly or deeply dope the link region compared to the base of the transistor. Therefore, unlike most double polysilicon process flows, the substantially different requirements for the base and link can be accommodated, for example, to provide for a base with low transit time, high breakdown voltage, low resistance, and a link region with low sheet resistance.

Furthermore, when the substrate is silicon, and the emitter material is polysilicon, there is reduced likelihood of silicon trenching of the extrinsic base regions during etching because the need to remove a polysilicon layer in intimate contact with the underlying silicon is avoided. In fact, known etch processes for suitable materials for the sacrificial layer, such as low density silicon dioxide, have high etch selectivity relative to the underlying silicon layer (>10:1). Thus an effective "etch stop" is provided for removing the sacrificial layer and exposing the emitter structure. The excellent etch selectivity allows for removal of a sacrificial layer while avoiding damage to the substrate. This is a major advantage for manufacturability and device reliability.

According to another aspect of the present invention there is provided a bipolar transistor structure comprising: a substrate having a well region of a first conductivity type; a base formed in a surface region of the well region, and comprising a heavily doped intrinsic base region of the second conductivity type and an adjacent extrinsic base region of said second conductivity type; an emitter overlying and self-aligned with the intrinsic base region and forming an emitter-base junction therewith; dielectric isolation on sidewalls of the emitter structure isolating sidewalls of the emitter from the extrinsic base region; the emitter structure providing a planarized emitter contact area, said emitter contact area being self-aligned within an area defined by the underlying intrinsic base region; and base contacts being provided to the extrinsic base region.

Thus the present invention provides a bipolar transistor structure and a method of forming a bipolar transistor in which the above-mentioned problems are avoided or reduced.

BRIEF DESCRIPTION OF THE DRAWINGS

An embodiment of the invention will now be described by way of example, with reference to the accompanying drawings, in which.

DESCRIPTION OF THE PREFERRED EMBODIMENT

Figure 1:
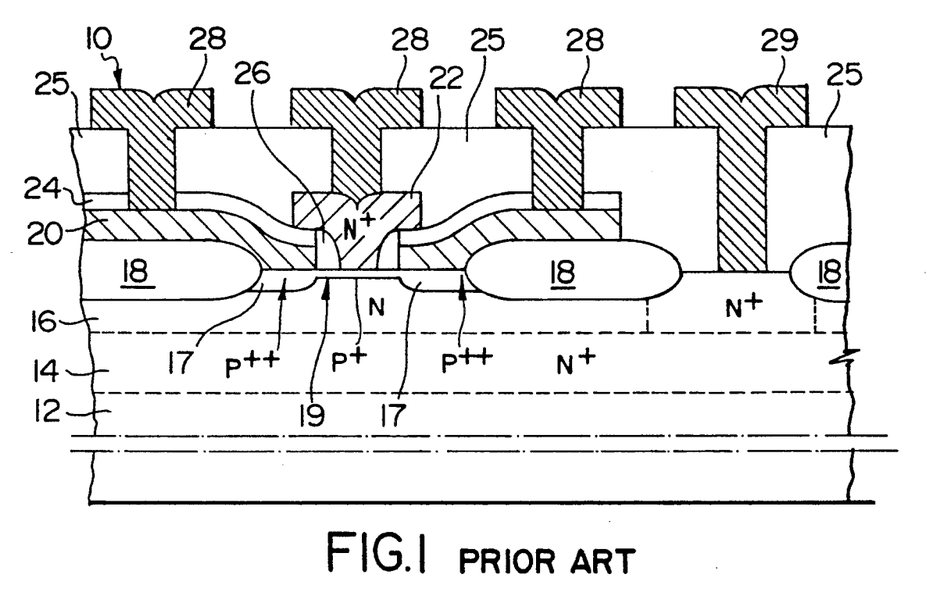
FIG. 1 shows a schematic cross-sectional view through part of an integrated circuit structure showing a bipolar transistor formed according to a known conventional prior art method.

A schematic cross-sectional view through a bipolar transistor 10 formed by a conventional known, prior art, double-polysilicon process is shown in FIG. 1, and comprises a substrate in the form of part of a silicon wafer 12 having formed therein a N+ well region 16 forming device islands isolated by a planarized field oxide layer 18. An underlying N+ layer 14 forms a buried collector, with dielectric trench isolation 13. An extrinsic base region 17 and intrinsic base region 19 are formed in the surface of the device well region 16. A first polysilicon layer 20 is deposited overall, including over the device well 16, and is patterned to define an emitter opening 21. The first polysilicon layer 20 forms the base contact electrodes to the extrinsic base region 17. Dielectric sidewall spacers 26 of oxide are formed on exposed sidewalls of base polysilicon surrounding the opening 21 defining the emitter contact region and a layer of dielectric 24, e.g. CVD silicon dioxide is then deposited overall. A second polysilicon layer 22 is then deposited overall, including on the intrinsic base region 19 in the emitter opening to form an emitter-base-contact 21 within the opening. After patterning the second polysilicon layer to define the emitter structure, base and emitter contacts 28 are formed to the first and second polysilicon layers by a conventional known method. A collector contact 29 to the N+ well region forming the collector is provided, spaced laterally from the base contacts. The resulting topography of the second polysilicon layer 22 forming the emitter is highly non-planar, as shown schematically in FIG. 1. In FIG. 1 and subsequent figures, N and P refer to negatively and positively doped semiconductor regions, with + and ++ to indicate heavy and very heavy doping respectively; and − indicates light doping.

In a method of forming a bipolar transistor structure 30 for a BiCMOS integrated circuit according to a first embodiment of the present invention (FIGS. 2 to 8) a substrate for an integrated circuit is provided in the form of a semiconductor silicon wafer 32 having a heavily doped buried layer 34, for example a layer of As or Sb doped N+ type silicon, overlaid by a 0.5 $\mu$m to 1.0 $\mu$m thick layer of epitaxial silicon 36 lightly doped with N type dopant, e.g. $5 \times 10^{15}$ cm$^{-3}$ in which is defined a device well region. The layers 34 and 36 are formed by a conventional method, for example, by epitaxial growth or alternatively by MeV ion implantation.

Figure 2:
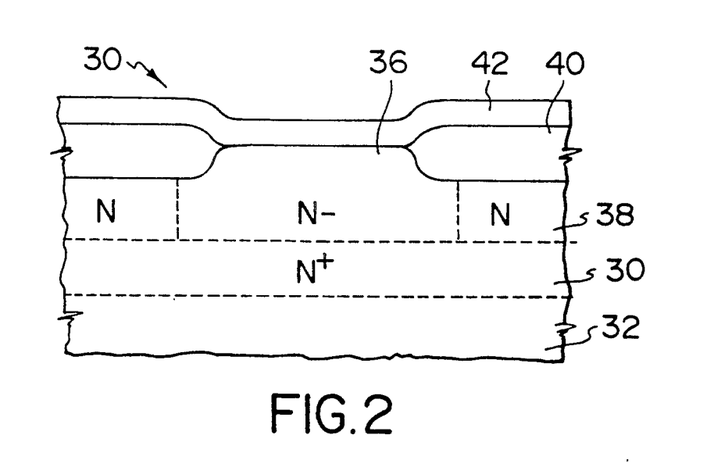
FIGS. 2, 3, 4, 5, 6, 7, 8 show a schematic cross-sectional view of part of an integrated circuit structure at successive stages in a method forming a bipolar transistor according to a first embodiment of the present invention.
Figure 3:
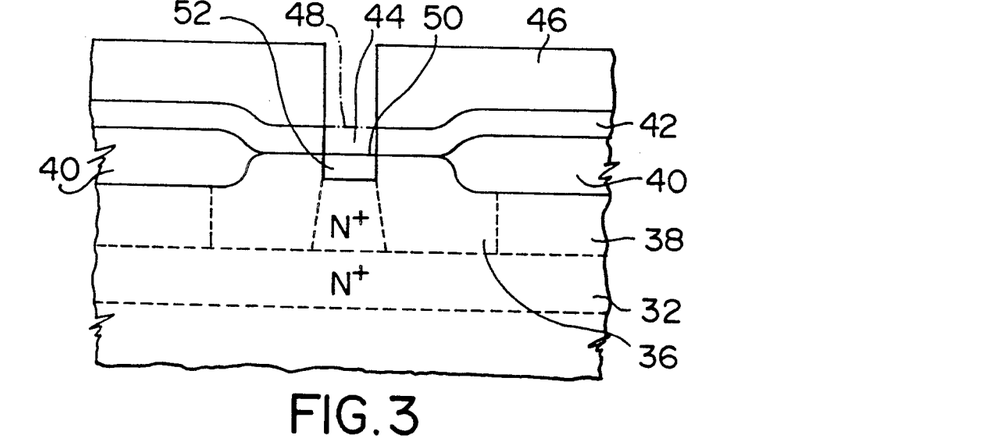

Preferably, a more heavily doped N well 38 is provided in the epitaxial layer 36, for example by implantation with N type ions at a dose in the $\sim 5 \times 10^{16}$ cm$^{-2}$ range, this implant being excluded from a device well region 36 in which a bipolar transistor is to be formed. The more heavily doped N well concentration provides for increasing the field threshold for the parasitic field oxide MOSFET or to serve as an appropriate well for CMOS transistors on the same die. Optionally, the dopant concentration is increased under the field oxide by the use of an N guard implant immediately prior to the field oxidation rather than during well formation.

A conventional field isolation layer 40 is formed, for example by a known fully recessed field oxide process to reduce surface topography for subsequent processing.

Subsequently, a sacrificial layer 42 is deposited overall. The sacrificial layer 42 comprises a material which can withstand subsequent process steps for forming an emitter structure, as will be described, and may be etched selectively relative to the underlying substrate material. For example, a well known suitable material for layer 42 comprises a low density CVD silicon dioxide layer. The oxide layer 42 is deposited overall, but it is not densified, as would be conventional, so that where the field isolation 40 is also silicon dioxide, the sacrificial layer is differentiated from the underlying field oxide layer 40 of silicon dioxide. Thus, plasma etching of the sacrificial oxide layer 42 can then be performed with at least 2:1 selectivity relative to the underlying field oxide 40 using a conventional dry etching process, that is a plasma etch or reactive ion etch process.

A conventional PE step is performed to define an emitter opening 44 (FIG. 3), that is, a step of coating the wafer with photoresist 46, and patterning to expose a region 48 of the sacrificial layer 42 in the device well region for defining an opening. The exposed region 48 of the sacrificial layer 42 is then etched by a conventional anisotropic etch process which is selective to the underlying silicon and to the field oxide outside the well region, to form a steep-sided opening 44 exposing the silicon surface 50 within the opening. After etching, but before stripping the photoresist 46, a base implant, comprising for example a dose of $\sim 2 \times 10^{13}$ cm$^{-2}$ of $<20$ keV boron ions, is performed to form a shallow intrinsic base region 52 in the surface of the well region within the opening. Optionally, a local collector implant, into the underlying region 54, is then performed so that the two implants are self-aligned within the emitter opening 44. The latter implant comprises, for example, a deep, i.e. high energy implant, of a dose of $5 \times 10^{12}$ cm$^{-2}$ of 350 keV phosphorous ions. The local collector implant may alternatively be performed before the base implant and annealed. The latter step allows for some lateral diffusion of the collector implant relative to the intrinsic base region, if desired.

Figure 4:
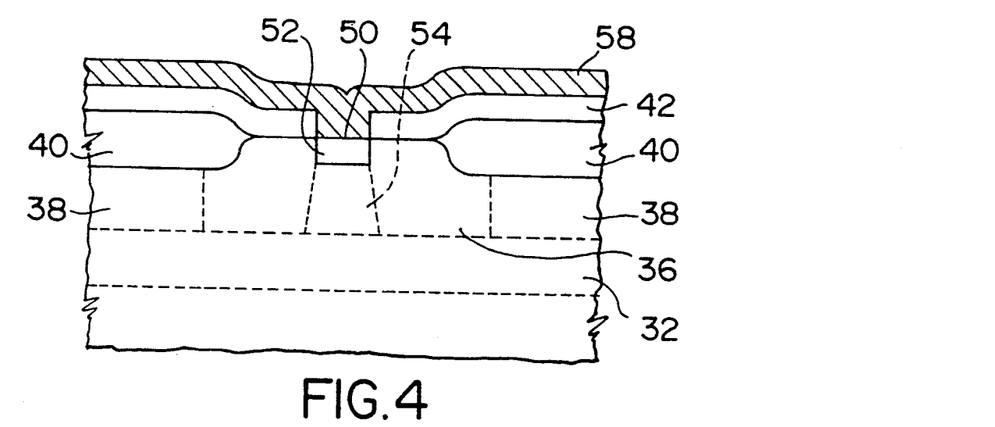

After stripping the resist, (FIG. 4) a conductive layer 58 of an emitter material is provided within the emitter opening, for example, heavily doped polysilicon, formed by a conventional method. The polysilicon layer 58 forming the emitter is either in situ doped or deposited undoped and subsequently doped by ion implantation, as described below. Preferably, the emitter layer 58 is formed immediately after removing any native oxide formed on the exposed silicon surface 50 of the intrinsic base, e.g. by dipping in HF, so as to ensure a good contact between the emitter layer 58 and the underlying silicon surface 50. When the layer of polysilicon 58 is deposited overall by a conventional method of CVD, the layer 58 must be thick enough to completely fill the emitter opening 44 defined in the oxide 42 without leaving a depression 45 in the growing surface of the polysilicon layer within the opening (FIG. 4). The polysilicon layer 58 is then etched back and planarized, preferably by a step of chemical mechanical polishing, or by another known polysilicon etch process, for example reactive ion or plasma etching. Thus, an emitter structure 60 of polysilicon remains in the emitter opening 44 formed by the sacrificial layer 42 (FIG. 5), and forms the emitter-base junction 61 with the underlying intrinsic base region 52.

Figure 5:
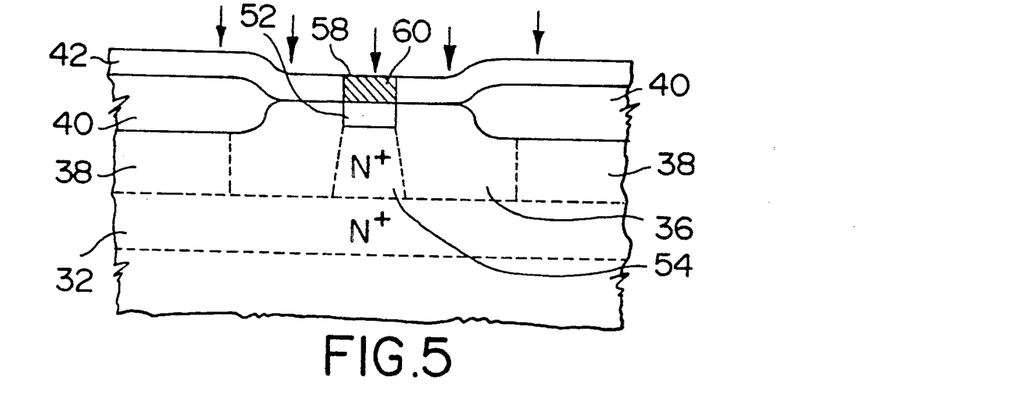

Deposition of polysilicon by CVD provides for running of the polysilicon layer 58 outside the device region over the field oxide, if required, e.g. for polysilicon structures of CMOS devices in a BiCMOS integrated circuit. An alternative method for forming the emitter is selective polysilicon growth, in which polysilicon 60 is grown selectively only in the emitter opening 44.

Figure 8:
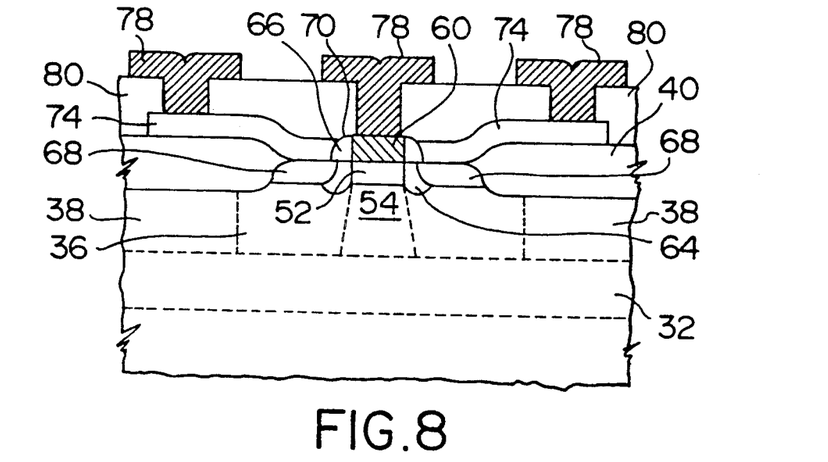

When the emitter layer 58 is not heavily doped in situ during deposition, after filling the emitter opening 44 by formation of the emitter polysilicon structure, i.e. the "emitter stripe" 60, implantation of the emitter stripe 60 with a high dose of N type dopant, e.g. As, is performed. The polysilicon layer 58 in the emitter region 60 should be thick enough to allow the implant to be performed without penetration of the implant ions through the polysilicon layer into the underlying base 52, and so that the emitter structure 60 is thick enough to sustain any loss during subsequent processing, such as salicidation of the surface region 62 for contact formation (FIG. 8). The thickness must be sufficient to provide high gain, that is to function as an excellent sink for back injected holes. Although a high dose implant into the polysilicon layer also dopes the exposed deposited oxide 42, the layer 42 is sacrificial and is subsequently removed along with the excess dopant.

Figure 6:
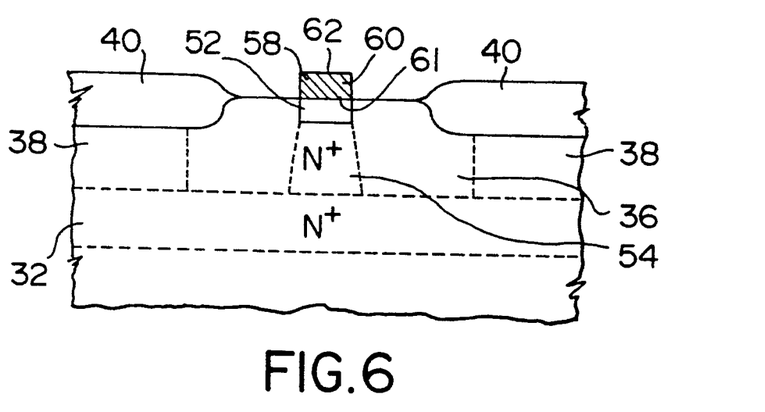

After stripping the oxide masking layer 42 by a conventional oxide etch process, sidewalls of the emitter structure are exposed adjacent the well region in which the extrinsic base contact region is to be formed (FIG. 6). Optionally, a link implant in the base region 64 adjacent the emitter is provided to create a low resistance path between the intrinsic device, and the extrinsic base contact area 68 without affecting the performance of the intrinsic device in a deleterious manner. The link implant may be performed after masking to leave an area 64 exposed in the device region 68 around the intrinsic base region, adjacent the emitter stripe 60. A low dose boron implant is provided in the exposed link region 64 of device well. A doping concentration of approximately equal to the base 52, or slightly higher and somewhat deeper is preferred. Preferably, the implant is retrograde (see FIG. 8) away from the surface to reduce the local electric field (corner field) and improve the breakdown field of the emitter-base junction.

Figure 7:
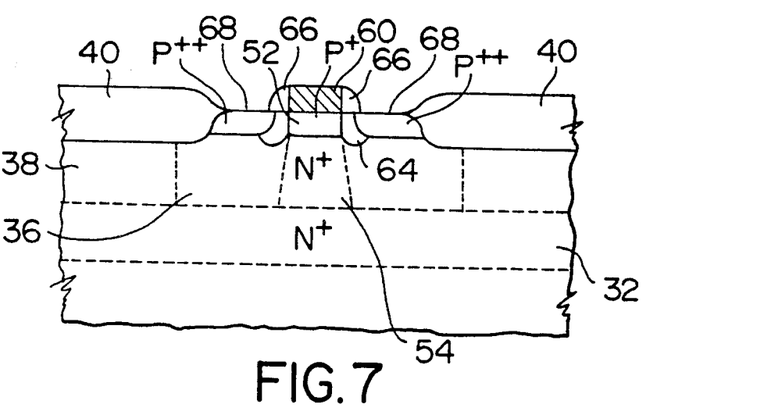

Localized isolation for the emitter in the form of a dielectric sidewall spacer 66 adjacent the emitter region 60 is then formed by conventional process steps, e.g. by deposition and anisotropic etching of a dielectric such as silicon dioxide (FIG. 7). The sidewall spacer provides isolation of the emitter from the extrinsic base region thus ensuring current is concentrated through the emitter-base junction, to reduce or avoid leakage around the sides of the emitter. Then a standard extrinsic p+ implant is performed into the extrinsic base contact regions 68, followed by an anneal at high temperature to repair implant damage. In fabricating BiCMOS structures, the latter steps for dielectric sidewall spacer (SWS) formation, implantation and annealing may be combined with appropriate CMOS steps for forming MOS devices, to reduce total process complexity.

The subsequent "back end" processing steps for providing contact metallization (FIG. 8) comprise known processes, for example the metallization steps commonly used in CMOS processing. Preferably, in forming a contact to the emitter stripe, and the extrinsic areas surrounding it, a thicker than conventional salicide layer is formed on the exposed emitter polysilicon layer 60. The thick salicide layer 70 is provided to overcome emitter resistance debiasing which occurs when a significant voltage drop occurs between the contact and any point along the emitter stripe. To reduce the resistive drop in the transistor, a self-aligned metallization, such as selectively deposited tungsten, is preferred over a conventional aluminium alloy metallization.

Process Flow for Emitter Structure of Single Polysilicon Self-Aligned NPN Bipolar Transistor for a BiCMOS IC 5000Å low density oxide deposition to form sacrificial layer
NPN PE to define emitter stripe region
oxide etch
local collector implant (N-type) $5 \times 10^{12}$ cm$^{-2}$ retrograde 350 keV into emitter stripe region
base implant (P-type) into emitter stripe region <20 keV, $2 \times 10^{13}$ cm$^{-2}$
polysilicon deposition (~8000Å)
polysilicon etch back leaving 4000Å emitter
N+ emitter implant $2 \times 10^{16}$ cm$^{-2}$
deposited oxide strip to remove sacrificial layer
optional link PE for link base region
link implant, (P-type) $5 \times 10^{13}$ cm$^{-2}$ 30 keV
SWS dielectric deposition 2000Å silicon dioxide
oxide etch back for NPN bipolar and CMOS Thus in a typical process flow for forming a single polysilicon bipolar transistor for a BiCMOS integrated circuit, as described above, only one mask level is required to form the emitter. In comparison, two mask levels are required to form the emitter in the known double-polysilicon process described above.

As mentioned above, in forming a polysilicon emitter, heavily doped polysilicon may alternatively be provided by CVD with in situ doping, rather than by ion implantation of undoped polysilicon. CVD polysilicon, being formed by an established process, provides ease of use and manufacturability and is a preferred emitter material. Alternatively, provision of an emitter by selective growth of polysilicon is advantageous in allowing for growth selectively within the emitter opening. Thus etching back for removal of excess polysilicon by chemical mechanical polishing or a conventional etch back process is avoided.

The process of the embodiment is also adaptable for forming silicon heterojunction bipolar transistors SiHBTs using alternative emitter or base materials, including high band gap emitter materials such as silicon carbide (SiC); a silicon germanium (SiGe) base, or alternative lower band gap materials. A suitable process for forming doped silicon carbide for emitter structures is, for example described in copending U.S. patent application Ser. No. 953373, to S. P. Tay et al., entitled "Formation Of Silicon Carbide", filed 30 Sep. 1992.

In the single polysilicon process of the embodiment, there is no self-aligned polysilicon base contact present as in conventional double polysilicon processes. A principle reason for a polysilicon base contact electrode in a double polysilicon process is to reduce the parasitic capacitance and resistance associated with the alignment overlap tolerance between levels. In the absence of a polysilicon base contact, there may be additional capacitance in the single polysilicon structure where contact is provided over an active device well area. Advantageously, the use of a local collector implant and a light N well for the device regions of the transistor substantially reduces the parasitic capacitance and is sufficient for many applications. As shown in FIG. 8, contact metallization may comprise for example, a local interconnect conductor 74 which is provided to move the base contact 78 out onto an adjacent field isolation area 40. This structure provides a similar advantage for a single polysilicon process flow as a polysilicon base contact, without most of the disadvantages associated with the extra topography of a second polysilicon layer.

The process of the embodiment provides limited emitter contact area compared with known double-polysilicon processes, but the process avoids many of the manufacturability problems associated with highly non-planar topography of known double-polysilicon processes. Placement of the emitter contact may be a concern for manufacturability of a process if unrestricted contact placement is required in a standard process. Because there is a limited window for forming an emitter contact, if the sidewall spacer is formed of a dielectric material which is relatively etch resistant compared with silicon dioxide, e.g. tantalum oxide, or silicon nitride, there is some allowance for contact misregistration (i.e. relative registration error+contact width) when opening the emitter contact.

In comparison with known non-self-aligned processes for forming bipolar transistors, the structure provides for reduced parasitic capacitances and resistances. Lithographic registration errors, and critical dimensional variability between layers is reduced, particularly in the steps for emitter formation and base formation.

Furthermore, self-alignment of the base, collector and link implants allows more flexibility in the choice of these implants. Since the implants for the base region and the link region of the base contact region are completely independent, implants for each area can be separately optimized. The requirement for PE steps is reduced because one primary mask can provide all patterning for forming an emitter structure. The link implant may be self-aligned with the emitter structure, or an additional mask may be used to define the link implant region, if required in a BiCMOS process. Thus, the process results in a cost reduction and yield improvement for bipolar transistors for BiCMOS ICs.

Clearly, while the embodiment describes a process for formation of a NPN bipolar transistor, a PNP bipolar transistor structure may be provided by a complementary process to provide elements of opposite conductivity type, if required.

Figure 9:
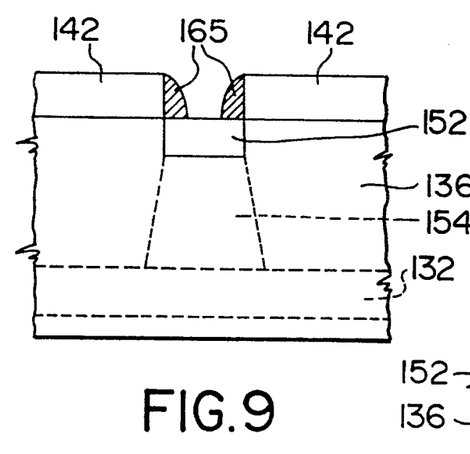
FIGS. 9, 10, 11 show a schematic cross-sectional view of part of an integrated circuit structure at successive stages in a method forming a bipolar transistor according to a second embodiment of the present invention.
Figure 10:
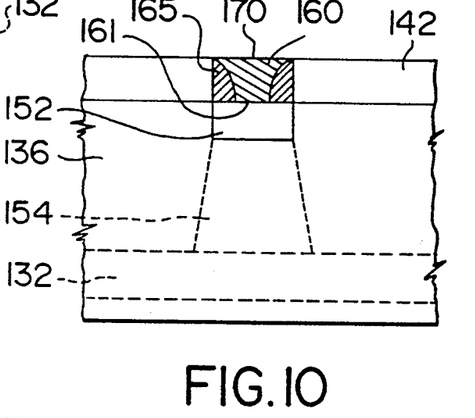
Figure 11:
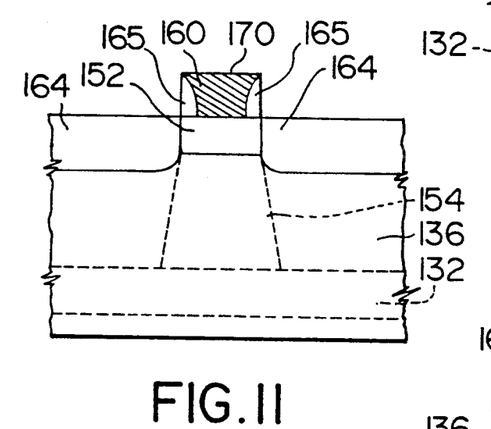
Figure 12:
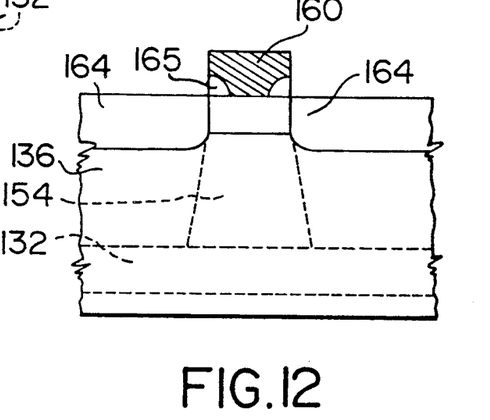
FIG. 12 shows a schematic cross-sectional view showing a modification of the emitter structure of FIG. 11.

In a process flow according to a second embodiment, a bipolar transistor is formed by steps as in the first embodiment, except that after defining an emitter opening in the sacrificial masking layer, sidewalls of the emitter opening are tapered. In the example shown in FIGS. 9 to 11, elements which are similar to those of the first embodiment are denoted by the same reference numeral incremented by 100. The process steps are similar to those of the first embodiment except that the sidewalls of the opening 144 are tapered by forming dielectric sidewall spacers 165 within the opening after formation of the intrinsic base region 152 by ion implantation. The sidewall spacers 156 provide a self-aligned layer of dielectric for isolation of the emitter layer (FIG. 9). In particular, the edges of the emitter structure 160 are isolated from the extrinsic base region 164 by the sidewall spacers 165. Also, after deposition of the emitter material within the opening, the tapered sidewall spacers 165 result in formation of a tapered emitter structure 160 which has a narrow base-emitter contact area 161, and which widens and forms a larger emitter contact region 170 on the exposed surface of the emitter structure. Thus while the emitter-base junction width is reduced, satisfactory contact area to the emitter is provided. A modification of the emitter structure of the second embodiment is shown in FIG. 12, in which sidewall spacers 165 are formed only in the lower part of the opening in the sacrificial layer.

In another modification of the second embodiment (not shown) a self-aligned intrinsic base region is provided by selective epitaxial growth of a base material within the opening in the sacrificial layer, either before or after formation of the sidewall spacers.

Although particular embodiments of the invention have been described in detail, it should be appreciated that numerous modifications, variations and adaptations may be made without departing from the scope of the invention as defined in the claims.

What is claimed is:

1. A method of forming a bipolar transistor, comprising:
   providing a substrate for an integrated circuit comprising a semiconductor layer having a device well region of a first conductivity type;
   providing thereon a sacrificial layer;
   selectively removing the sacrificial layer from an area of the device well to define an opening through the sacrificial layer exposing the device well region within the opening;
   forming a base region of a second conductivity type within the opening;
   providing a layer of an emitter material of the first conductivity type within the opening in the sacrificial layer to form an emitter structure, the emitter structure forming an emitter-base junction with the base region;
   completely removing the sacrificial layer and exposing sides of the emitter structure and the device well adjacent the base region;
   and, forming base contact regions of a second conductivity type in the device well region adjacent the base region, and providing a dielectric isolation layer on the exposed sides of the emitter structure thereby isolating the sides of the emitter structure from the base contact regions.

2. A method according to claim 1 wherein the layer of emitter material is selectively provided within the opening in the sacrificial layer.

3. A method according to claim 1 wherein providing a layer of an emitter material of the first conductivity type comprises providing a layer of heavily doped polysilicon selectively within the opening.

4. A method according to claim 3 comprising depositing a layer of polysilicon overall, etching back the polysilicon layer form the sacrificial layer to leave a polysilicon emitter structure only in the opening.

5. A method according to claim 3 comprising providing an emitter material by selective growth of polysilicon within the opening.

6. A method according to claim 1 wherein the well region comprises silicon and providing a sacrificial layer comprises depositing a layer of low density silicon dioxide.

7. A method according to claim 1 wherein forming a base region within the opening comprises forming a heavily doped surface layer within the opening by ion implantation with low energy ions of said second conductivity type.

8. A method according to claim 1 wherein forming a base region comprises selective growth of a layer of a base material of said second conductivity type within the opening.

9. A method according to claim 1 including a step of forming a local collector region in the device well before forming the emitter structure, the step of forming a local collector region comprising ion implanting a dopant species of the first conductivity type into the device well region, the implant being self-aligned through the opening in the sacrificial layer.

10. A method according to claim 1 comprising subsequently forming electrically conductive contacts to the base contact regions and to the emitter structure.

11. A method according to claim 1 comprising after the step of completely removing the sacrificial layer, forming a link region of the base by ion implanting a dopant species of the second conductivity type into the exposed device well contiguous with the base region.

12. A method according to claim 1 wherein providing a dielectric isolation layer comprises forming dielectric sidewall spacers on exposed sides of the emitter structure.

13. A method according to claim 12 wherein forming sidewall spacers comprises depositing a layer of dielectric selected from the group consisting of silicon dioxide, silicon nitride or tantalum oxide.

14. A method according to claim 1 wherein the emitter material is heavily doped by ion implantation.

15. A method according to claim 1 wherein after forming the base region and before providing the layer of emitter material within the opening, comprising a step of forming a dielectric sidewall space on sidewalls of the sacrificial layer defining the opening for isolating the emitter structure from the base contact region adjacent the base region.

16. A method according to claim 1 wherein
the step of forming a base region comprises ion implantation of dopant ions of said second conductivity type through the opening into a surface region of the device well region, and comprising
a further step of forming a local collector region in the device well underlying and self-aligned with the base region, comprising ion implantation of a dopant of a first conductivity type through the opening into the device well region.

17. A method according to claim 16 comprising:
selectively masking the sacrificial layer with a coating of photoresist before selectively removing the sacrificial layer; and,
wherein said ion implantation steps for forming the base region and local collector region are performed before stripping the photoresist, whereby the coating of photoresist provides an implant mask for said ion implantation steps,
and then stripping the photoresist before the step of providing a layer of an emitter material within the opening in the sacrificial layer.

18. A method of forming a bipolar transistor for an integrated circuit comprising:
providing an N type device well region in a semiconductor substrate for an integrated circuit;
providing a sacrificial layer overall and patterning the sacrificial layer to define an opening in the device well region;
ion implanting with N type dopant species to form a local collector region in the device well region, the implant being self-aligned within the emitter opening;
ion implanting a surface region with P type dopant species to form a P+ type self-aligned intrinsic base region within the opening;
providing a N type layer of an emitter material within the opening in the sacrificial layer to form an emitter structure filling the opening, and thereby forming a emitter-base junction with the underlying intrinsic base region;
removing the sacrificial layer and exposing sidewalls of the emitter structure;
providing a dielectric isolation layer on exposed sidewalls of the emitter structure;
ion implanting P type dopant in the exposed device well region surrounding emitter structure to provide P++ extrinsic base regions for electrically contacting the intrinsic base region.

19. A method of forming a bipolar transistor comprising:
providing a substrate for an integrated circuit comprising a semiconductor layer having a device well region of a first conductivity type;
providing a sacrificial layer overall and patterning the sacrificial layer to define an opening therethrough over the device well region;
forming a base region of a second conductivity type within the opening;
forming a local collector region in the device well underlying and self-aligned with the base region, by ion implantation of a dopant of a first conductivity type into the device well through the opening in the sacrificial layer;
providing a layer of an emitter material of the first conductivity type within the opening in the sacrificial layer to form an emitter structure, the emitter structure forming an emitter-base junction with the base region;
removing the sacrificial layer and exposing sides of the emitter structure and the device well adjacent the base region;
forming base contact regions in the device well region adjacent the base region, and providing a dielectric isolation layer on exposed sides of the emitter structure for isolating sides of the emitter structure from the base contact regions.

20. A method according to claim 19 wherein after the step of removing the sacrificial layer and before the step of forming the isolation layer on exposed sides of the emitter structure, the method comprises forming a link region of the base by ion implantation of a dopant of a second conductivity type into the device well region contiguous with the base region.

21. A method according to claim 19 wherein
the step of forming a base region comprises ion implantation of a dopant of a second conductivity type into a surface region of the device well within the opening to provide a heavily doped base region, whereby the collector and base regions are self-aligned with the opening in the sacrificial layer.

22. A method according to claim 19 wherein
the step of forming a base region comprises selective growth of a layer of base material of the second conductivity type within the opening in the sacrificial layer.

23. A method according to claim 19 wherein the step of forming a local collector region precedes the step of forming a base region.

24. A method of forming a bipolar transistor, comprising:

providing a substrate for an integrated circuit comprising a semiconductor layer having a device well region of a first conductivity type;

depositing a sacrificial layer thereon;

selectively removing the sacrificial layer to define an opening therethrough exposing an area of the device well region;

forming a base region of a second conductivity type in a surface region of the device well within the opening in the sacrificial layer by ion implantation of a dopant of a second conductivity type through the opening in the sacrificial layer, and forming a local collector region in the device well by ion implantation a dopant of a first conductivity type through the opening in the sacrificial layer, the base and collector regions thereby being self-aligned;

then, providing a layer of an emitter material of the first conductivity type within the opening in the sacrificial layer to form an emitter structure, the emitter structure forming an emitter-base junction with the base region;

completely removing the sacrificial layer and exposing sides of the emitter structure and the device well region adjacent the base region;

forming base contact regions of a second conductivity type in the device well region adjacent the base region, and providing a dielectric isolating layer on exposed sides of the emitter structure for isolating sides of the emitter structure from the base contact regions.

25. A method according to claim 24 comprising after the step of exposing sides of the emitter structure, forming a link region of the base by ion implantation of dopant of a second conductivity type into the exposed device well region contiguous with the base region.

26. A method according to claim 25 wherein, after forming the link region of the base, forming the dielectric isolation layer comprises forming dielectric sidewall spacers on the exposed sides of the emitter structure for isolating sides of the emitter from the base contact regions.

27. A method according to claim 24 comprising a step of self-aligned silicidation of exposed surfaces of the emitter structure and base contact regions.

* * * * *